US008499208B2

(12) United States Patent
Dieffenderfer et al.

(10) Patent No.: US 8,499,208 B2
(45) Date of Patent: Jul. 30, 2013

(54) METHOD AND APPARATUS FOR SCHEDULING BIST ROUTINES

(75) Inventors: James Norris Dieffenderfer, Apex, NC (US); Anand Krishnamurthy, Cary, NC (US); Clint Wayne Mumford, Apex, NC (US); Jason Lawrence Panavich, Pittsboro, NC (US); Ketan Vitthal Patel, Cary, NC (US); Ravi Rajagopalan, Cary, NC (US); Thomas Philip Speier, Holly Springs, NC (US)

(73) Assignee: QUALCOMM Incorporated, San Diego, CA (US)

( * ) Notice: Subject to any disclaimer, the term of this patent is extended or adjusted under 35 U.S.C. 154(b) by 1237 days.

(21) Appl. No.: 11/553,609

(22) Filed: Oct. 27, 2006

(65) Prior Publication Data
US 2008/0115026 A1 May 15, 2008

(51) Int. Cl.
*G01R 31/28* (2006.01)

(52) U.S. Cl.
USPC .......................................... 714/733; 714/738

(58) Field of Classification Search
USPC ....................................................... 714/733
See application file for complete search history.

(56) References Cited

U.S. PATENT DOCUMENTS

| | | | | |
|---|---|---|---|---|
| 5,506,959 A * | 4/1996 | Cockburn | ........................ | 714/42 |
| 6,367,042 B1 * | 4/2002 | Phan et al. | .................... | 714/733 |
| 6,701,474 B2 * | 3/2004 | Cooke et al. | ................... | 714/724 |
| 6,728,916 B2 * | 4/2004 | Chen et al. | ...................... | 714/733 |
| 6,760,865 B2 * | 7/2004 | Ledford et al. | .................. | 714/30 |
| 6,858,447 B2 * | 2/2005 | Hartmann et al. | ............... | 438/14 |
| 7,010,736 B1 * | 3/2006 | Teh et al. | ........................ | 714/733 |
| 7,036,062 B2 * | 4/2006 | Morris et al. | ................... | 714/733 |
| 7,117,415 B2 * | 10/2006 | Forlenza et al. | .............. | 714/733 |
| 7,143,323 B2 * | 11/2006 | Sweet | ........................... | 714/724 |
| 7,275,195 B2 * | 9/2007 | Martinez | ........................ | 714/733 |
| 7,305,595 B2 * | 12/2007 | Goodwin et al. | .............. | 714/718 |
| 7,346,823 B1 * | 3/2008 | Maheshwari et al. | ......... | 714/733 |
| 7,406,645 B2 * | 7/2008 | Nozuyama | ..................... | 714/738 |
| 7,533,309 B2 * | 5/2009 | Mukherjee et al. | ............ | 714/718 |
| 7,644,333 B2 * | 1/2010 | Hill et al. | ........................ | 714/732 |
| 2003/0154426 A1 * | 8/2003 | Chow et al. | ..................... | 714/30 |

* cited by examiner

*Primary Examiner* — Steve Nguyen
(74) *Attorney, Agent, or Firm* — Nicholas J. Pauley; Sam Talpalatsky; Joseph Agusta

(57) ABSTRACT

The content and order of a predetermined sequence of hard-coded and/or quasi-programmable test patterns may be altered during a Built-In Self-Test (BIST) routine. As such, knowledge gained post design completion may be reflected in the selection and arrangement of available tests to be executed during a BIST routine. In one embodiment, a sequence of hard-coded and/or quasi-programmable tests is executed during a BIST routine by receiving test ordering information for the sequence of tests and executing the sequence of tests in an order indicated by the test ordering information. A corresponding BIST circuit comprises a storage element and a state machine. The storage element is configured to store test ordering information for the sequence of tests. The state machine is configured to execute the sequence of tests in an order indicated by the test ordering information.

30 Claims, 8 Drawing Sheets

METHOD AND APPARATUS FOR SCHEDULING BIST ROUTINES

BACKGROUND

1. Field of the Invention

The present invention generally relates to Built-In Self-Test (BIST), and particularly relates to scheduling test execution during a BIST routine.

2. Relevant Background

Built-In Self-Test (BIST) is a methodology that enables a device such as an integrated circuit, board or system to test itself. Built-in test equipment, hereinafter referred to as a BIST engine, includes hardware and/or software incorporated into a device for providing BIST capability. BIST may be used to test memory, digital logic, analog, or mixed-signal portions of an integrated circuit. Conventional BIST engines comprise a test pattern generator, an output-response analyzer and a BIST state machine. Under control of the BIST state machine, the output-response analyzer observes the response of a device to a sequence of tests generated by the test pattern generator. If the device's response matches an expected response, then it passes the BIST routine. Otherwise, the device fails.

Low-complexity BIST engines execute a sequence of available hard-coded and/or quasi-programmable tests at speeds supported by the corresponding circuit under test. Some tests may be hard-coded in the sense that their content becomes unalterable once the BIST engine design is finalized. Other tests may be quasi-programmable in that their content may be partially (but not fully) programmable after design finalization, e.g., their data pattern may be altered but not how the data is loaded and corresponding results stored. Conventionally, slower external test equipment is used only to initiate a BIST routine, e.g., by providing seed values to the BIST engine. Once initialized, the BIST engine executes the available tests at high speeds, thus reducing test time. However, the order in which tests are executed by low-complexity BIST engines is conventionally fixed, and thus cannot be altered once the design of the BIST engine is finalized.

However, the ideal content and order of a BIST routine may not be determinable until after the design has been completed and actual hardware produced. For example, circuit simulation during the design phase cannot with complete accuracy predict all possible functional conditions of the circuit being designed. In addition, process variations may cause unforeseen or unpredictable behavior. As such, a more complete understanding of a circuit's functional behavior is not known until after the circuit has been built and fully characterized. This includes determining an ideal test execution order for a BIST routine.

For example, it may be later determined that a particular test execution order set during the design process may not be ideal in that the tests most likely to detect a fail are not scheduled early in a conventional fixed-order BIST routine. As such, numerous BIST test cycles pass before executing the tests most likely to detect a fail, thus reducing the efficiency of conventional low-complexity BIST engines. Further, it may be discovered post-design completion that certain tests included in a fixed-order BIST routine may not detect fails, rarely detect fails or are redundant. However, such tests are conventionally executed by low-complexity BIST engines despite their later discovered inefficiency.

Complex BIST engines provide greater test flexibility by implementing a single test program that is fully programmable. Unlike low-complexity BIST engines, their more complex counterparts do not execute a sequence of tests. Instead, equipment external to the BIST engine programs the content associated with a single test program to be executed. As such, the test program may be altered or reprogrammed without requiring re-design of the BIST engine. However, many tester cycles are consumed programming the contents of a complicated BIST test program via external equipment. Further, external test equipment used to load BIST program content conventionally functions at speeds much slower than that of the internal circuitry associated with the circuit under test. As a result, the test time needed to 'upload' the content of a programmable BIST routine from a tester to a circuit under test can be lengthy, thus increasing overall cost of a circuit under test. In addition, a single programmable BIST test must be programmed multiple times to ensure proper test coverage.

SUMMARY OF THE DISCLOSURE

According to the methods and apparatus taught herein, the content and order of Built-In Self-Test (BIST) routines may be altered after design completion. As such, knowledge gained after the design phase has been completed may be reflected in the selection and arrangement of available hard-coded and/or quasi-programmable tests to be executed during a BIST routine. For example, a predetermined sequence of tests may be altered so that tests most likely to detect circuit faults are executed at the beginning of a BIST routine, thus improving BIST efficiency. In another example, tests that provide redundant test coverage or that are not likely to detect circuit faults may be excluded from a BIST routine, further improving BIST efficiency. The flexibility to alter the order and content of a sequence of available hard-coded and/or quasi-programmable tests post design completion enables a more efficient use of system resources when executing BIST routines.

According to one embodiment, a sequence of hard-coded and/or quasi-programmable tests is executed during a built-in self-test (BIST) routine by receiving test ordering information for the sequence of tests and executing the sequence of tests in an order indicated by the test ordering information. According to some embodiments, the BIST routine may be terminated before the entire sequence of tests is executed, e.g., in response to an abort code retrieved from test identifier information or based on a test exit point indicating a total number of the tests to be executed during the BIST routine.

According to one embodiment, a BIST circuit that executes a sequence of hard-coded and/or quasi-programmable tests comprises a storage element and a state machine. The storage element is configured to store test ordering information for the sequence of tests. The state machine is configured to execute the sequence of tests in an order indicated by the test ordering information. The test ordering information assigned to the tests may be implemented in various ways. In some embodiments, the test ordering information corresponds to information that identifies the tests, e.g., a test identifier stored in a latch circuit. Different test identifiers may be sequentially loaded into the latch circuit, thus changing the order in which tests are executed. In other embodiments, the test ordering information corresponds to test enable and priority information. The enable information indicates which of the tests are to be executed and the priority information determines test execution order. The information is modifiable, thus enabling the content and order of BIST routines to be altered. In yet other embodiments, the test ordering information corresponds to the order in which test identifiers are stored in a register where the test identifiers are uniquely associated with the tests, e.g., IDs or seed values. The BIST circuit may be included in any integrated circuit capable of self-test, e.g., a microprocessor.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
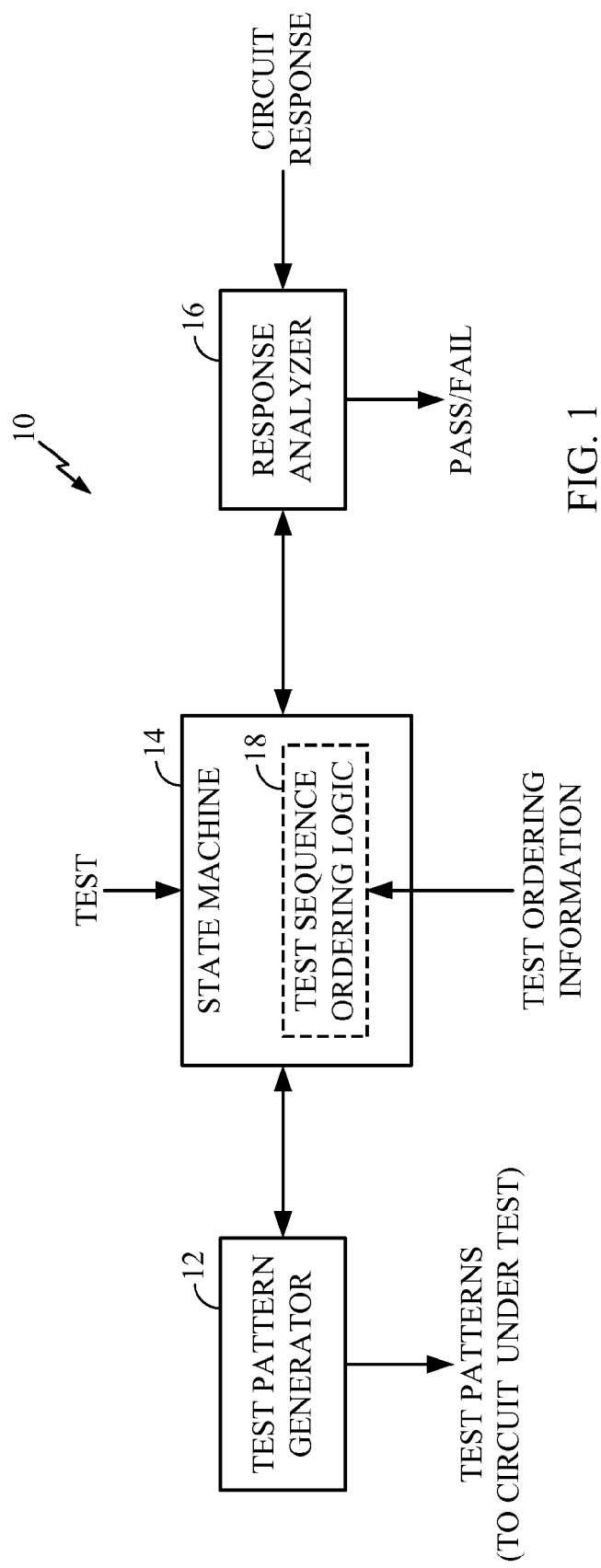
FIG. 1 is a block diagram illustrating an embodiment of a Built-In Self-Test (BIST) engine having test sequence ordering logic.

FIG. 1 illustrates an embodiment of a Built-In Self-Test (BIST) engine 10 that may be included in any integrated circuit capable of self-test, e.g., a microprocessor or memory device (both not shown). During a BIST routine, the BIST engine 10 executes a sequence of hard-coded tests and/or quasi-programmable tests generated by a test pattern generator 12 included in or associated with the BIST engine 10. Tests generated by the test pattern generator 12 may be exhaustive, pseudo-exhaustive, random, and/or pseudo-random. To that end, the test pattern generator 12 may comprise one or more of a Feedback Shift Register (FSR) such as a Linear FSR (LFSR), counters or other circuitry for generating test patterns and/or non-volatile memory (not shown) such as Read Only Memory (ROM) for storing test patterns.

Regardless of how the tests are generated, the BIST engine 10 further comprises a state machine 14 for controlling execution of BIST routines and a response analyzer 16 for determining pass/fail results. During a BIST routine, logic 18 included in or associated with the BIST state machine 14 determines the order in which a sequence of hard-coded and/or quasi-programmable tests is executed by the BIST engine 10. That is, the test ordering logic 18 can arrange a sequence of tests in any desirable order. Further, the test ordering logic 18 can exclude one or more of the available tests from a particular BIST routine. As such, the content and order of BIST routines may be altered after the design of the BIST engine 10 has been frozen, thus enabling more efficient BIST execution.

Figure 2:
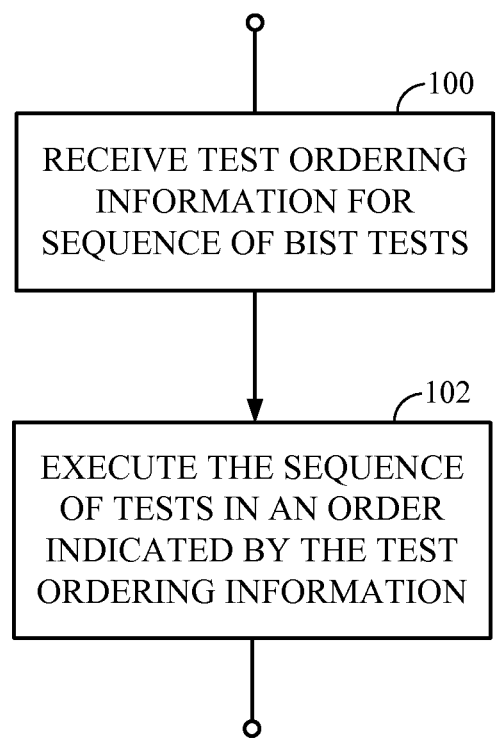
FIG. 2 is a logic flow diagram illustrating an embodiment of program logic for altering the execution order of a sequence of hard-coded tests.

In more detail, the BIST state machine 14 initiates a BIST routine in response to a test control signal (TEST) received by the BIST engine 10. Once initiated, the BIST engine 10 provides a sequence of hard-coded and/or quasi-programmable tests to a circuit under test (not shown). The test ordering logic 18 determines which ones of the available tests are included in the test sequence and in what order the tests are executed based on test ordering information received by the BIST engine 10, as illustrated by Step 100 of FIG. 2. The test ordering information may correspond to any information suitable for indicating the content and execution order of a predetermined sequence of tests during a BIST routine. Under control of the state machine 14, the test pattern generator 12 produces the identified tests and provides them to the circuit under test for execution in the order indicated by the test ordering logic 18, as illustrated by Step 102 of FIG. 2. The circuit under test outputs a response reflecting the circuit's reaction to the ordered sequence of tests. The response analyzer 16 receives the circuit response and analyzes it to determine whether particular tests detected a fault. This pass/fail information produced by the BIST engine 10 may be used to attempt fault correction or to discard the integrated circuit under test if fault correction is not available.

Figure 3:
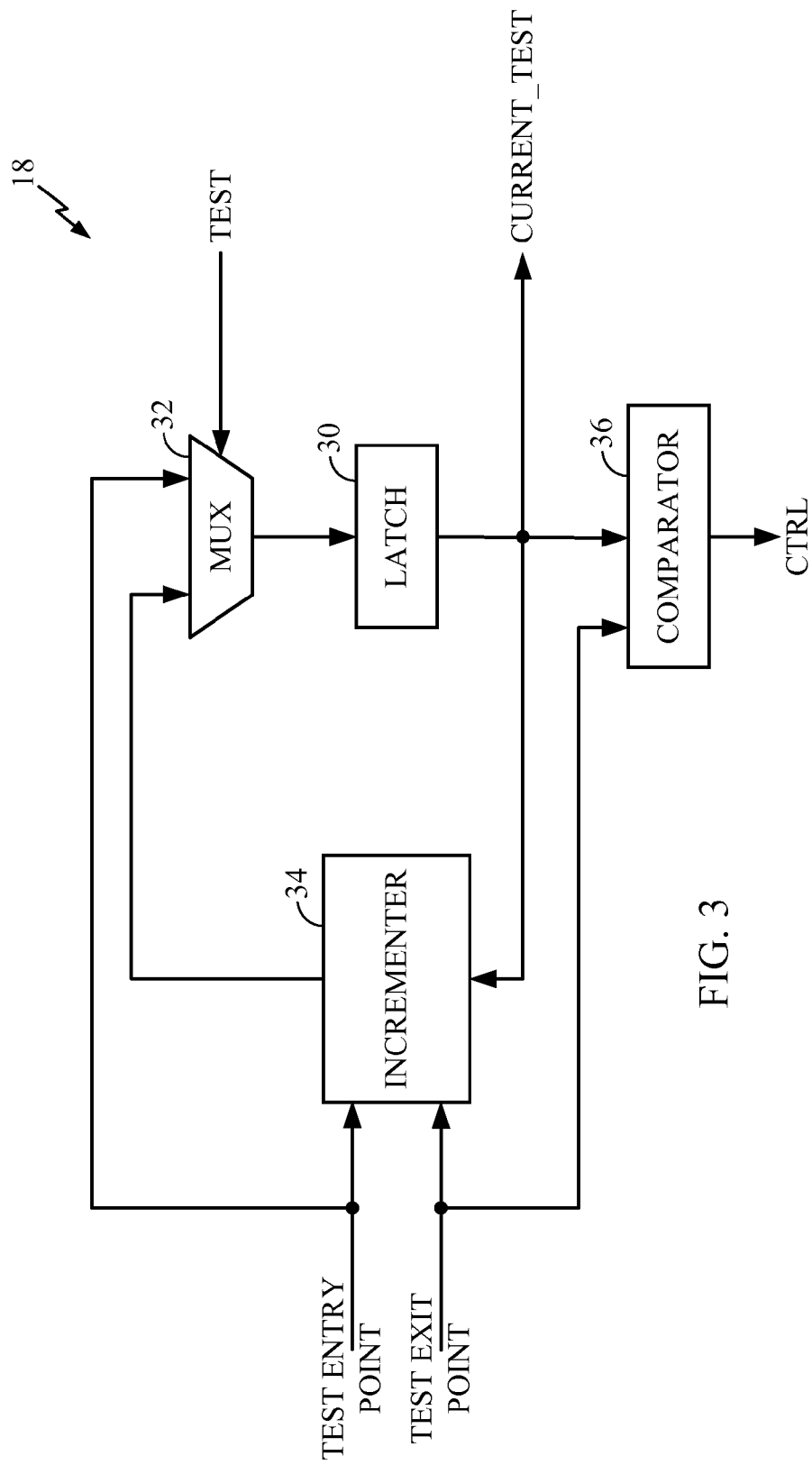
FIG. 3 is a block diagram illustrating one embodiment of the test sequence ordering logic of FIG. 1.

FIG. 3 illustrates one embodiment of the test ordering logic 18 included in or associated with the BIST engine 10 where the test ordering information corresponds to a test entry point, e.g., a test identifier such as a test index value. According to this embodiment, the test ordering logic 18 determines which available test will be executed first during a BIST routine in response to the test entry point input received by the BIST engine 10. That is, the test entry point indicates the test included in a predetermined sequence of hard-coded and/or quasi-programmable tests to be executed first. The test entry point is programmable in that it can be altered after the design of the BIST engine 10 is finalized, thus enabling the BIST engine 10 to execute BIST routines starting at different test entry points.

After receiving the test entry point, the test ordering logic 18 loads it into a latch circuit 30. When a test is to be executed by the BIST engine 10, the BIST state machine 14 accesses the output of the latch circuit 30 (CURRENT_TEST) to identify which test is currently selected for execution. The identified test is then executed by the BIST engine 10. As a result, the test ordering logic 18 uses the test entry point input to identify which test is executed first from a predetermined sequence of available tests, thus allowing the BIST engine 10 to alter test execution order.

In more detail, a test control signal (TEST) is activated at the beginning of a new BIST routine to indicate that the BIST engine 10 should initiate the new routine. In response to the signal, a multiplexer 32 causes the latch circuit 30 to capture the test entry point input. The corresponding test is then executed first. After the test corresponding to the test entry point input is executed first, the BIST engine 10 subsequently executes successive tests. To that end, an incrementer 34 included in or associated with the test ordering logic 18 increments the test identifier output of the latch circuit 30 each time a test is executed. The output of the incrementer 34 is then steered into the latch circuit 30 by the multiplexer 32. In response, the BIST state machine 14 causes the test corresponding to the test identifier output by the latch circuit 30 to be executed.

In one embodiment, all available hard-coded and quasi-programmable tests are executed, and thus, only the test order is altered by the BIST engine 10. In another embodiment, a test exit point input indicates that some of the available tests in the original sequence are to be skipped during a BIST routine. Thus, not all available tests are executed. According to this embodiment, the test ordering logic 18 causes the test identified by the test entry point to be executed first and then causes a subset of available successive tests to be executed. Each successive test is executed until the test identified by the test exit point input is loaded into the latch circuit 30. When this occurs, a comparator 36 generates a signal (CTRL) indicating that the desired number of tests has been executed. In response, the BIST engine 10 ends the BIST routine.

Figure 4:
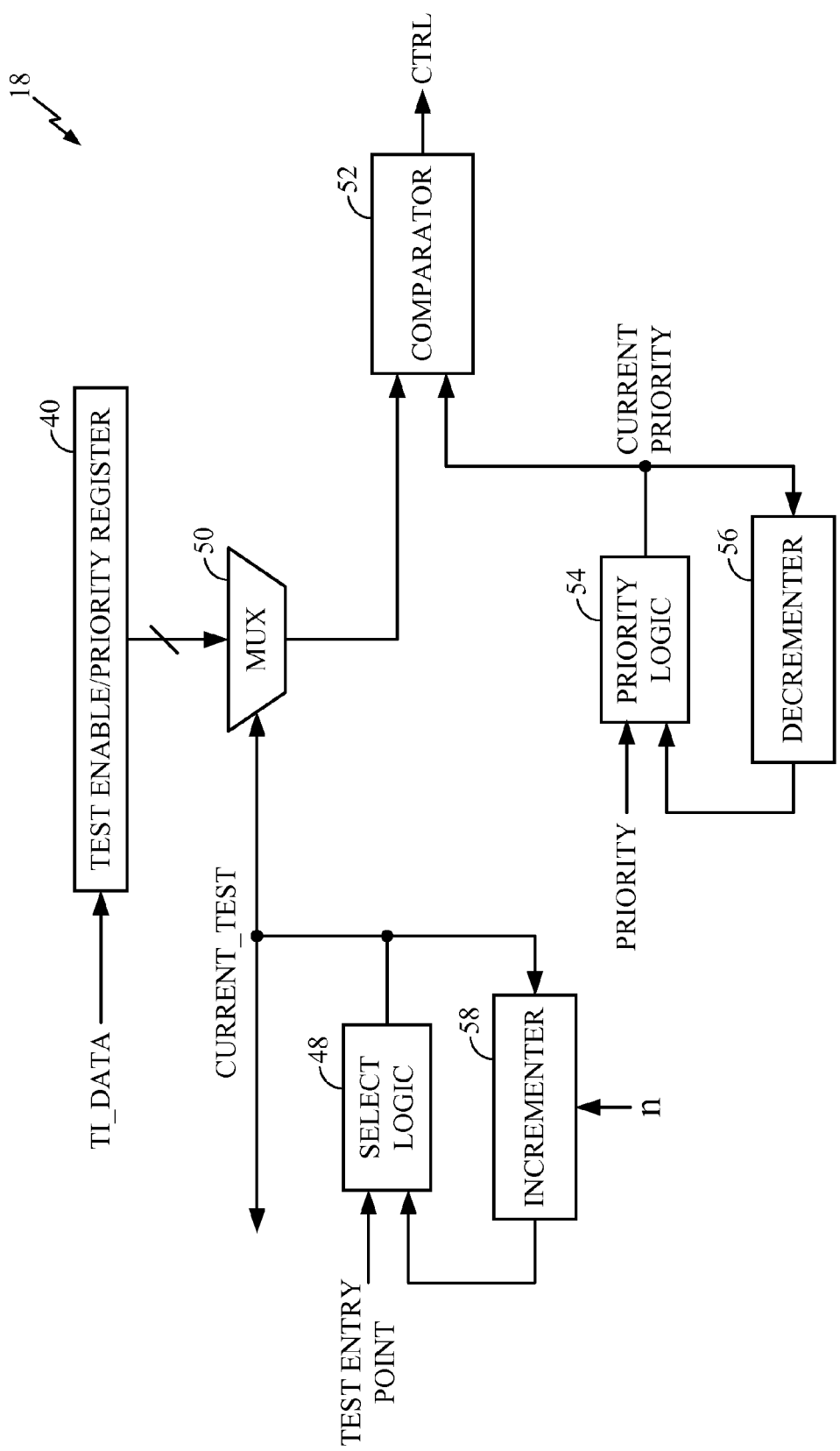
FIG. 4 is a block diagram illustrating another embodiment of the test sequence ordering logic of FIG. 1.
Figure 5:
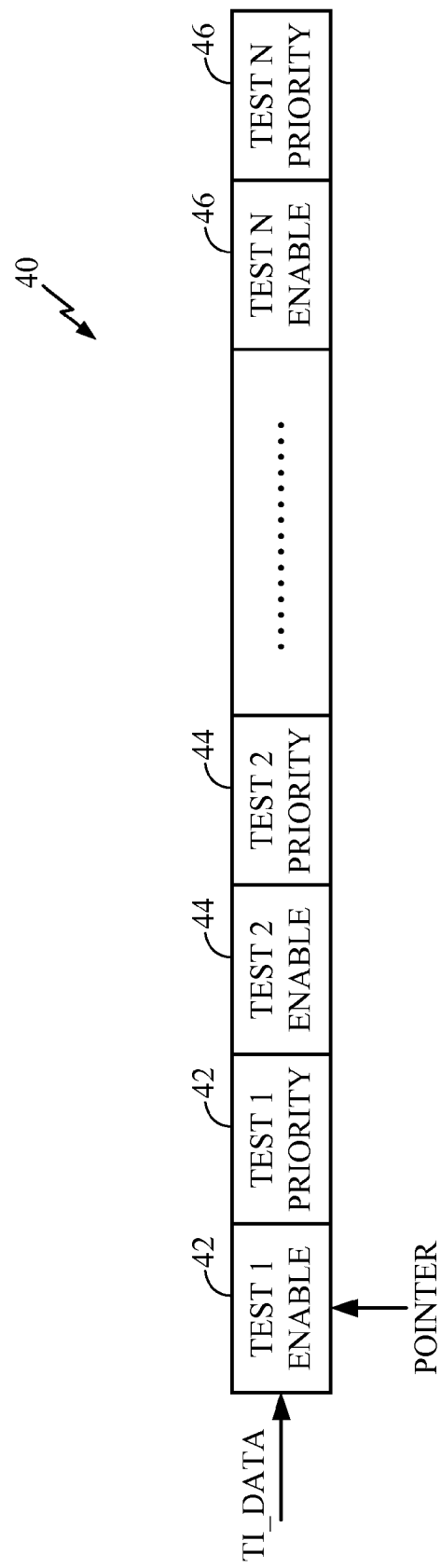
FIG. 5 is a block diagram illustrating an embodiment of a register accessed by the test sequence ordering logic of FIG. 4.

FIG. 4 illustrates another embodiment of the test ordering logic 18 where the test ordering information corresponds to a sequence of test enable and priority information loaded into a register 40 included in or associated with the test ordering logic 18. The register 40 contains information associated with each test available to the BIST engine 10, e.g., as shown in more detail in FIG. 5. According to this embodiment, each available test is associated with a corresponding register entry 42-46, e.g., the first register entry 42 is associated with test one, the second entry 44 is associated with test two, etc. A pointer, e.g., the CURRENT_TEST signal shown in FIG. 4, indicates the register entry 42-46 currently selected.

In one embodiment, the register entries 42-46 contain test enable and priority information for each available test. The enable information, e.g., an enable bit, indicates whether a particular test is to be executed or not. The priority information indicates the priority level of each test, e.g., one or more priority bits indicating a desired priority level associated with each test. During operation, the enable and priority information is loaded into the register 40, e.g., from a primary test input (TI_DATA). The test ordering logic 18 uses the enable information stored in the register 40 to determine which tests should be executed. In addition, the test ordering logic 18 uses the priority information to determine test execution order for the enabled tests.

In more detail, select logic 48 receives a test entry point at the beginning of a new BIST routine, e.g. a test index value. In response, the select logic 48 provides a signal (CURRENT_TEST) to a multiplexer 50 which indicates the test to be executed first during a BIST routine. In response to the signal, the multiplexer 50 selects the corresponding register entry 42-46. Initially, the multiplexer 50 selects the register entry 42-46 corresponding to the test entry point, e.g., the first entry 42. The contents of the currently selected register entry are examined by the test ordering logic 18 to determine whether the corresponding test should be executed. The test ordering logic 18 issues a signal (CTRL) to the BIST state machine 14 indicating whether the currently selected test should be executed or not.

Particularly, a comparator 52 first determines whether the enable information retrieved from the currently selected register entry indicates that the corresponding test should be executed, e.g., whether or not an enable bit has been set. If enabled, the comparator 52 then determines whether the corresponding priority information indicates that the selected test has a priority greater than or equal to a current priority level (CURRENT PRIORITY). If the test is not enabled or if its priority is lower than the current level, the comparator 52 directs the BIST state machine 14 to skip the presently selected test (via the CTRL signal). To the contrary, if the currently selected test is enabled and has a sufficient priority, the test is executed.

Priority logic 54 determines the current priority. At the beginning of a new BIST routine, the priority logic 54 sets the current priority to a level indicated by a priority input signal (PRIORITY). The priority logic 54 decreases the current priority level after all enabled tests having a priority matching or exceeding the current level are executed. In one embodiment, a decrementer 56 causes the priority logic 54 to decrease the current level after all tests satisfying the current priority are executed.

While the priority logic 54 and decrementer 56 set the current priority level, the select logic 48 and a corresponding incrementer 58 control which register entry is currently selected. At the beginning of a new BIST routine, the register entry corresponding to the test entry point input is selected. The incrementer 58 determines the next register entry based on the current test and the total number of entries (n) in the register. Each time a test is executed, the incrementer 58 causes the select logic 48 to successively increment the current register pointer until the last entry 46 in the register 40 is selected. At that point, the incrementer 58 causes the select logic 48 to wrap the pointer back to the first register entry 42. From there, the incrementer 58 once again causes the select logic 48 to successively increment the pointer. Regardless, the process of successively altering and wrapping the current test identifier is repeated for each priority level serviced by the test ordering logic 18. This ensures that each register entry 42-46 is examined to determine whether a corresponding test should be executed or not for each supported priority level.

Figure 6:
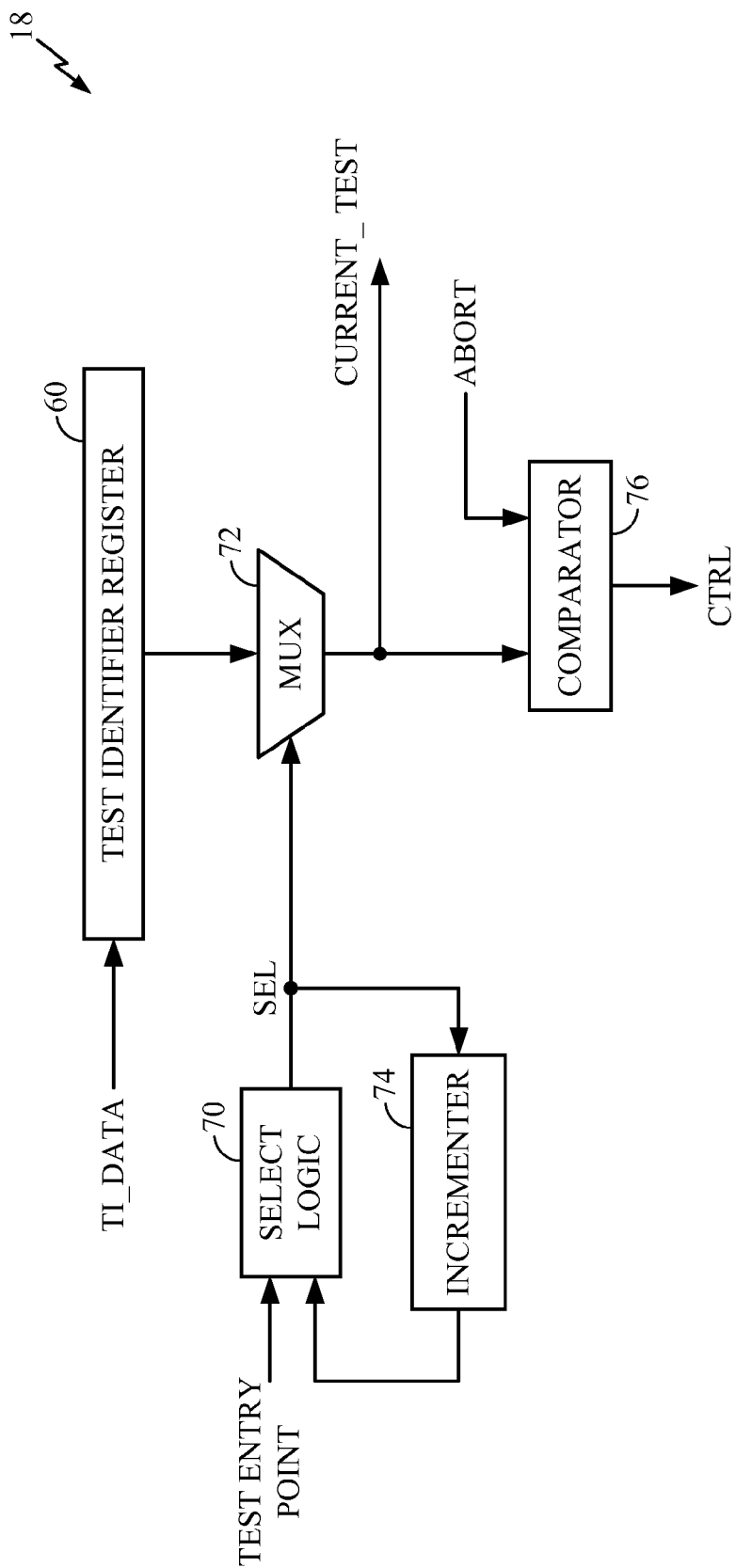
FIG. 6 is a block diagram illustrating yet another embodiment of the test sequence ordering logic of FIG. 1.
Figure 7:
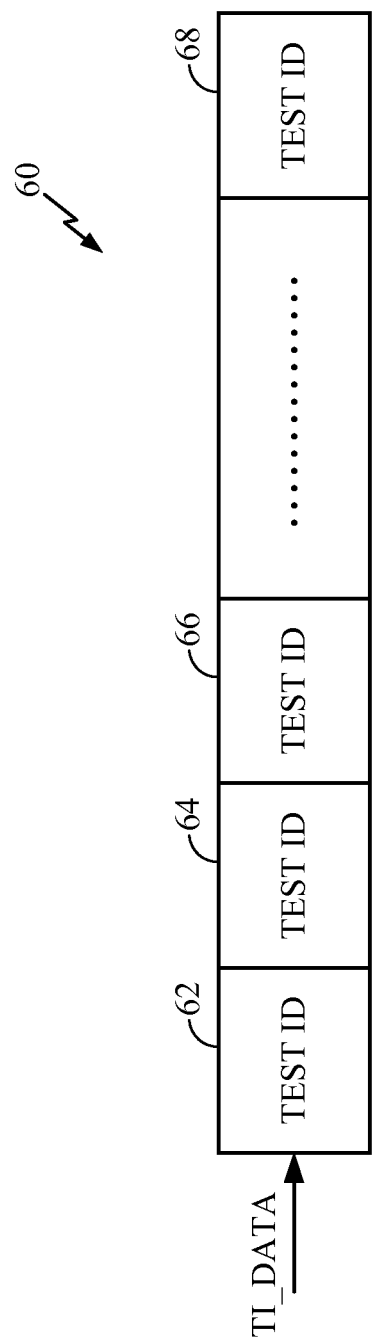
FIG. 7 is a block diagram illustrating an embodiment of a register accessed by the test sequence ordering logic of FIG. 6.

FIG. 6 illustrates yet another embodiment of the test ordering logic 18 where the test ordering information corresponds to a series of test identifiers loaded into a register 60 included in or associated with the test ordering logic 18. According to this embodiment, the test ordering logic 18 determines test execution order based on the order in which test identifiers are stored in the register 60. The register 60 has a plurality of entries 62-68, as shown in more detail in FIG. 7. Each register entry 62-68 contains an identifier associated with a test available to the BIST engine 10.

A particular test is executed by the BIST engine 10 so long as its corresponding identifier is stored in one of the register entries 62-68. In one embodiment, the identifiers are IDs that identify particular tests, e.g., IDs that single out tests stored in a ROM (not shown). In another embodiment, the identifiers are seed values provided to the test pattern generator 12. Each seed value represents a different test comprising a series of patterns where the patterns are produced by initializing a FSR such as a LFSR (both not shown) with a corresponding seed value.

Regardless, test identifiers are loaded into the register 60 during operation of the BIST engine 10, e.g., from a primary test input (TI_DATA). The test ordering logic 18 uses the identifiers stored in the register 60 to determine which tests are to be executed and in what order. Initially, select logic 70 causes a multiplexer 72 to select the identifier corresponding to a test entry point input, e.g., the first entry 62 of the register 60. The BIST state machine 14 then causes the test corresponding to the test identifier retrieved from the first entry 62 to be executed first during a BIST routine (CURRENT_TEST). Each time a test is executed, an incrementer 74 and the select logic 70 cause the multiplexer 72 to retrieve a successive identifier from the register 60. In turn, the BIST state machine 14 causes a test corresponding to each successively retrieved identifier to be executed.

Optionally, the test ordering logic 18 may direct the BIST state machine 14 to stop a BIST routine before completion in response an abort code (ABORT). In some situations, it may be desirable to execute only a subset of all available tests. In such situations, the test ordering logic 18 notifies the BIST state machine 12 via a notification signal (CTRL) that an ongoing BIST routine should end. In one embodiment, a comparator 76 generates the notification signal when an identifier retrieved from the register 60 matches an abort code. That is, one identifier state may be reserved for indicating the abort, e.g., all logic zeros or all logic ones. When the comparator 76 detects the abort code, the notification signal is activated. In response, the BIST state machine 14 ends the current BIST routine. In essence, undesirable tests such as tests that are unlikely to detect fails or redundant tests can be skipped during a BIST routine by loading an abort code into an appropriate register entry 62-68. For example, an abort code may be loaded into the register 60 after all identifiers associated with desirable tests have been previously loaded. As such, the BIST engine 10 executes the desired tests and then ends the BIST routine when the abort code is retrieved from the register 60, thus saving test time by not executing undesirable tests.

Figure 8:
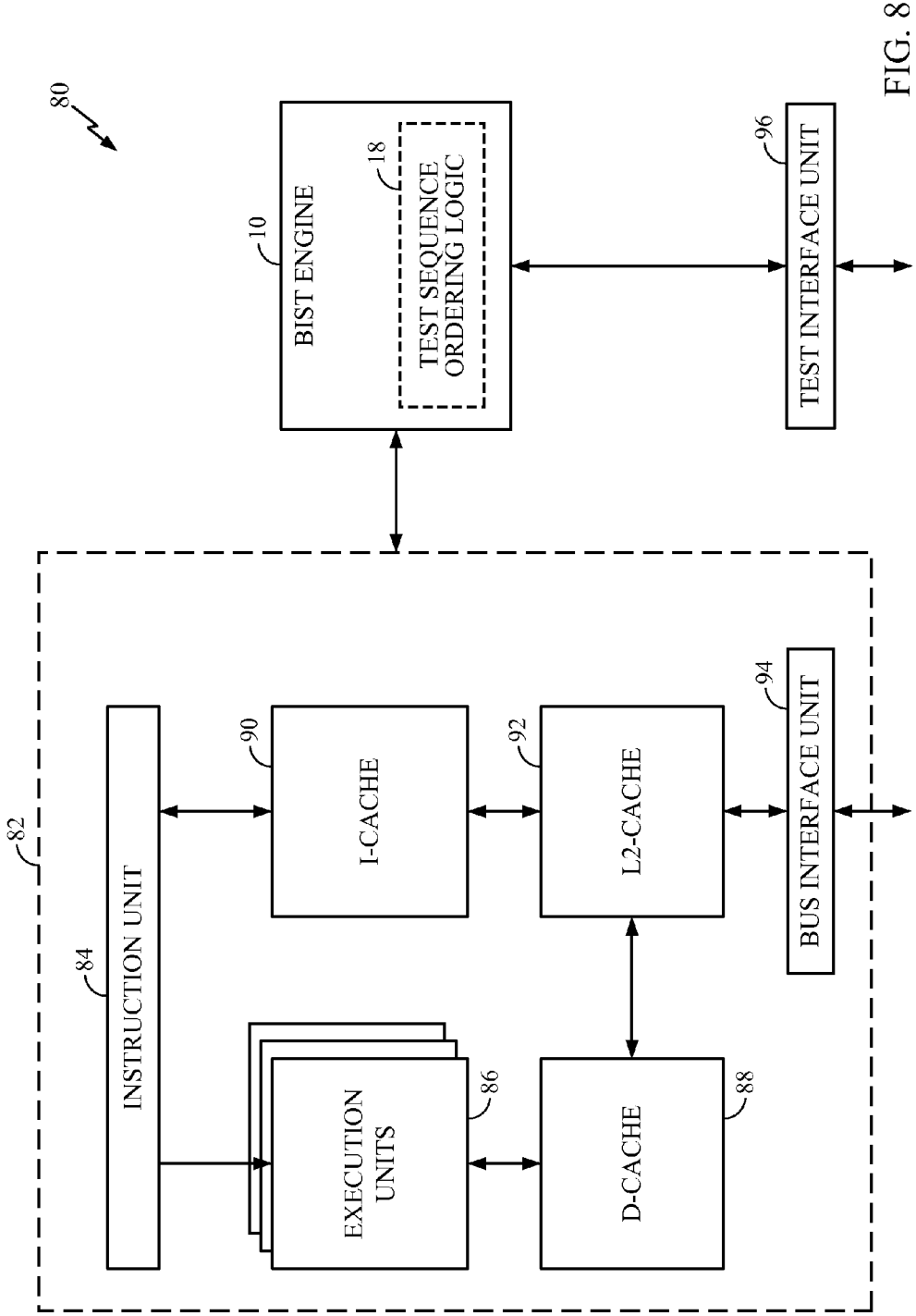
FIG. 8 is a block diagram illustrating an embodiment of a microprocessor including the BIST engine of FIG. 1.

The several non-limiting embodiments disclosed herein demonstrate how the BIST engine 10 can alter the content and order of a BIST routine. Turning now to an exemplary use of the BIST engine 10, FIG. 8 illustrates an embodiment of a microprocessor 80 including the BIST engine 10. The microprocessor 80 embodiment is presented as a non-limiting example illustrating the inclusion of the BIST engine 10 in an integrated circuit. Those skilled in the art will readily recognize that the BIST engine 10 disclosed herein may be included in any integrated circuit having self-test capability such as memory devices, digital signal processors, analog integrated circuits, mixed-signal integrated circuits, application-specific integrated circuits, etc.

In addition to the BIST engine 10 which includes the test ordering logic 18, the microprocessor 80 also includes functional circuitry 82. The functional circuitry 82 implements the processing functions supported by the microprocessor 80. Among other components, the functional circuitry 82 includes an instruction unit 84, one or more execution units 86, first-level data and instruction caches 88, 90, a second-level cache (L2 cache) 92, and a bus interface unit 94. The instruction unit 84 provides centralized control of instruction flow to the execution units 86. The execution units 86 execute instructions dispatched by the instruction unit 84. The data and instruction caches 88, 90 store data and instructions, respectively. The L2 cache 92 provides a high-speed memory buffer between the data and instruction caches 88, 90 and memory (not shown) external to the microprocessor 80 while the bus interface unit 94 provides a mechanism for transferring data, instructions, addresses, and control signals to and from the microprocessor 80.

The BIST engine 10 tests the functional circuitry 82 of the microprocessor 80 for faults by executing a sequence of hard-coded and/or quasi-programmable tests designed to identify particular fault types. Signals that control the setup and operation of the BIST engine 10 as described herein may be communicated to the microprocessor 80 via a dedicated test interface unit 96, e.g., an IEEE 1149.1 Joint Test Access Group (JTAG) compatible test interface. Alternatively, the microprocessor bus interface unit 94 may be used to communicate such signals.

Regardless, the BIST engine 10 may be designed to test various components of the functional circuitry 82. For example, the BIST engine 10 may execute logic-based BIST routines for testing the instruction unit 84 and the execution units 86. The BIST engine 10 may further execute memory-based BIST routines for testing the caches 88, 90 and 92, e.g., BIST routines for testing a random access memory portion and a content addressable memory portion (both not shown) of the caches 88, 90 and 92. Other routines may be executed by the BIST engine 10 depending on the integrated circuit type, e.g., analog and mixed-signal based BIST routines. Tests generated by the BIST engine 10 may be delivered to the functional circuitry 82 and corresponding circuit responses received from the circuitry 82 via any suitable mechanism such as scan chains or a dedicated test bus (both not shown).

For each BIST routine executed by the BIST engine 10, the test ordering logic 18 included in the BIST engine 10 determines which ones of available hard-coded and/or quasi-programmable tests are executed and in what order. As such, a predetermined sequence of tests can be altered during a BIST routine in response to knowledge gained after the design phase has been completed, e.g., knowledge gained from historical test data generated by external test equipment. Because the BIST efficiency associated with a predetermined sequence of tests may not be precisely known before design completion, the test ordering logic 18 provides a mechanism for re-ordering and re-grouping the test sequence based on after-acquired knowledge, thus improving BIST efficiency.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. During a built-in self-test (BIST) routine, a method of executing a sequence of two or more tests, the tests comprising a combination of hard-coded tests and quasi-programmable tests, the method comprising:

receiving test ordering information for the sequence of tests, the sequence being selected from hard-coded tests and quasi-programmable tests of a BIST routine selected to test different functional circuits of an integrated circuit according to an integrated circuit type;

executing the sequence of tests, to test the different functional circuits of the integrated circuit to identify particular fault types, in an order indicated by the test ordering information; and preventing one or more of the tests from executing during the BIST routine.

2. The method of claim 1, wherein receiving test ordering information for the sequence of tests comprises receiving a test entry point.

3. The method of claim 2, wherein executing the sequence of tests in an order indicated by the test ordering information comprises:

executing first the test indicated by the test entry point; and subsequently executing successive unexecuted ones of the tests.

4. The method of claim 1, wherein receiving test ordering information for the sequence of tests comprises receiving test enable information and priority information associated with individual ones of the tests.

5. The method of claim 4, wherein executing the sequence of tests in an order indicated by the test ordering information comprises:

executing individual ones of the tests having enable information indicating test execution and priority information indicating a highest priority; and subsequently executing unexecuted ones of the tests having enable information indicating test execution and priority information indicating a priority lower than the highest priority.

6. The method of claim 1, wherein receiving test ordering information for the sequence of tests comprises receiving test identifier information uniquely associated with individual ones of the tests in an order indicating test priority.

7. The method of claim 6, wherein executing the sequence of tests in an order indicated by the test ordering information comprises executing the tests identified by the test identifier information in an order corresponding to the order in which the test identifier information is received.

8. The method of claim 6, further comprising ending the BIST routine before the entire sequence of tests is executed in response to an abort code retrieved from the test identifier information.

9. The method of claim 6, wherein the test identifier information comprises seed values uniquely associated with individual ones of the tests.

10. The method of claim 9, wherein executing the sequence of tests in an order indicated by the test ordering information comprises:
generating the tests based on the seed values in an order corresponding to the order in which the test identifier information is received; and
executing the generated tests in order.

11. The method of claim 1, wherein preventing one or more of the tests from executing during the BIST routine comprises ending the BIST routine before the entire sequence of tests is executed in response to a received test exit point.

12. The method of claim 11, wherein the test exit point indicates a desired number of tests to be executed during the BIST routine.

13. The method of claim 1, wherein the test ordering information indicates at least one of a likelihood of detecting a fail during the BIST routine by respective ones of the tests, a likelihood of not detecting a fail during the BIST routine by respective ones of the tests, and shortest redundant ones of the tests.

14. The method of claim 1, wherein the BIST routine comprises at least one of a logic BIST routine, a memory BIST routine, a content addressable memory BIST routine, an analog BIST routine, and a mixed-signal BIST routine.

15. The method of claim 1, the BIST routine is a logic-based BIST routine and the functional circuits comprise at least one of an instruction unit or an execution unit.

16. A built-in self-test (BIST) circuit for executing a sequence of two or more tests, the tests comprising a combination of hard-coded tests and quasi-programmable tests, the BIST circuit comprising:
a storage element configured to store test ordering information for the sequence of tests, the sequence being selected from hard-coded tests and quasi-programmable tests of a BIST routine selected to test different functional circuits of an integrated circuit according to an integrated circuit type; and
a state machine configured to execute the sequence of tests in an order indicated by the test ordering information to test the different functional circuits of the integrated circuit to identify particular fault types, and to prevent one or more of the tests from executing during the BIST routine.

17. The BIST circuit of claim 16, wherein the test ordering information corresponds to a test entry point.

18. The BIST circuit of claim 17, wherein the state machine is configured to execute the sequence of tests in an order indicated by the test ordering information by executing first the test indicated by the test entry point and subsequently executing successive unexecuted ones of the tests.

19. The BIST circuit of claim 16, wherein the test ordering information corresponds to test enable information and priority information associated with individual ones of the tests.

20. The BIST circuit of claim 19, wherein the state machine is configured to execute the sequence of tests in an order indicated by the test ordering information by executing individual ones of the tests having enable information indicating test execution and priority information indicating a highest priority and subsequently executing unexecuted ones of the tests having enable information indicating test execution and priority information indicating a priority lower than the highest priority.

21. The BIST circuit of claim 16, wherein the test ordering information corresponds to test identifier information uniquely associated with individual ones of the tests in an order indicating test priority.

22. The BIST circuit of claim 21, wherein the state machine is configured to execute the sequence of tests in an order indicated by the test ordering information by executing the tests identified by the test identifier information in an order corresponding to the order in which the test identifier information is stored in the storage element.

23. The BIST circuit of claim 21, wherein the state machine is further configured to end the BIST routine before the entire sequence of tests is executed in response to an abort code retrieved from the test identifier information.

24. The BIST circuit of claim 21, wherein the test identifier information comprises seed values uniquely associated with individual ones of the tests.

25. The BIST circuit of claim 24, wherein the state machine is configured to execute the sequence of tests in an order indicated by the test ordering information by generating the tests based on the seed values in an order corresponding to the order in which the test identifier information is stored in the storage element and executing the generated tests in order.

26. The BIST circuit of claim 16, wherein the state machine is configured to prevent one or more of the tests from executing during the BIST routine by ending the BIST routine before the entire sequence of tests is executed in response to a test exit point received by the BIST circuit.

27. The BIST circuit of claim 26, wherein the test exit point indicates a desired number of tests to be executed during the BIST routine.

28. The BIST circuit of claim 16, wherein the test ordering information indicates at least one of a likelihood of detecting a fail during the BIST routine by respective ones of the tests, a likelihood of not detecting a fail during the BIST routine by respective ones of the tests, and shortest redundant ones of the tests.

29. A built-in self-test (BIST) system comprising:
means for receiving test ordering information for a sequence of tests, the sequence being selected from hard-coded tests and quasi-programmable tests of a BIST routine selected to test different functional circuits of an integrated circuit according to an integrated circuit type; and
means for executing the sequence of tests, to test the different functional circuits of the integrated circuit to identify particular fault types, in an order indicated by the test ordering information; and
means for preventing one or more of the tests from executing during the BIST routine.

30. A non-transitory computer-readable storage medium comprising code, which, when executed by a processor, causes the processor to perform operations for executing a sequence of two or more tests during a built-in self-test (BIST) routine, the non-transitory computer-readable storage medium comprising:
code for receiving test ordering information for the sequence of tests, the sequence being selected from hard-coded tests and quasi-programmable tests of a BIST routine selected to test different functional circuits of an integrated circuit according to an integrated circuit type; and
code for executing the sequence of tests, to test the different functional circuits of the integrated circuit to identify particular fault types, in an order indicated by the test ordering information; and
code for preventing one or more of the tests from executing during the BIST routine.

\* \* \* \* \*